United States Patent
Tezcan et al.

(10) Patent No.: US 8,809,188 B2
(45) Date of Patent: Aug. 19, 2014

(54) METHOD FOR FABRICATING THROUGH SUBSTRATE VIAS

(75) Inventors: Deniz Sabuncuoglu Tezcan, Neerwinden (BE); Yann Civale, Leuven (BE); Bart Swinnen, Holsbeek (BE); Eric Beyne, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/885,311

(22) Filed: Sep. 17, 2010

(65) Prior Publication Data

US 2011/0089572 A1 Apr. 21, 2011

Related U.S. Application Data

(63) Continuation of application No. PCT/EP2009/052922, filed on Mar. 12, 2009.

(60) Provisional application No. 61/037,992, filed on Mar. 19, 2008.

(51) Int. Cl.
*H01L 21/44* (2006.01)

(52) U.S. Cl.
USPC ............ 438/667; 438/672; 438/675; 257/698

(58) Field of Classification Search
CPC ..... H01L 23/48; H01L 21/768; H01L 21/486; H01L 23/481; H01L 23/49827; H01L 21/76898; H01L 21/76877
USPC ................. 438/584, 597, 666, 667, 672, 675; 257/618, 698, 774, E21.577, E21.585, 257/E23.011
See application file for complete search history.

(56) References Cited

U.S. PATENT DOCUMENTS

| | | | |
|---|---|---|---|
| 6,522,002 B1 * | 2/2003 | Shinkawata | 257/757 |
| 6,611,030 B1 | 8/2003 | Lee | |
| 7,285,477 B1 * | 10/2007 | Bernstein et al. | 438/455 |
| 2006/0223301 A1 * | 10/2006 | Vanhaelemeersch et al. | 438/618 |
| 2007/0069364 A1 | 3/2007 | Kawano et al. | |
| 2007/0155150 A1 * | 7/2007 | Kim | 438/597 |
| 2007/0190692 A1 * | 8/2007 | Erturk et al. | 438/118 |
| 2008/0020488 A1 * | 1/2008 | Clevenger et al. | 438/3 |
| 2008/0090403 A1 * | 4/2008 | Schlangen et al. | 438/599 |
| 2009/0149023 A1 * | 6/2009 | Koyanagi | 438/666 |

FOREIGN PATENT DOCUMENTS

WO WO 2006/019156 A 2/2006

OTHER PUBLICATIONS

Tezcan et al, Slope through wafer vias for 3D wafer level packaging, Proceedings of the 57th Electronic Components and Technology Conference, pp. 643-647, May 29-Jun. 1, 2007, Reno NV.

(Continued)

*Primary Examiner* — Khiem D Nguyen
(74) *Attorney, Agent, or Firm* — Knobbe, Martens, Olson & Bear LLP

(57) ABSTRACT

A method of fabricating through substrate vias is disclosed. In one aspect, vias are etched from the backside of the substrate down to shallow trench isolation (STI) or the pre-metal dielectric stack (PMD). Extra contacts between metal 1 contact pads and the through-wafer vias are fabricated for realizing the contact between the through wafer vias and the back-end-of-line of the semiconductor chips.

15 Claims, 13 Drawing Sheets

(56) References Cited

OTHER PUBLICATIONS

Steve Lassig, Manufacturing integration considerations of through-silicon via etching, Solid State Technology—The international magazine for semiconductor manufacturing, Dec. 2007.

International Search Report dated Jul. 6, 2009 for PCT/EP2009/052922.
Written Opinion dated Sep. 19, 2010 for PCT/EP2009/052922.
International Preliminary Report on Patentability dated Sep. 21, 2010 for PCT/EP2009/052922.

* cited by examiner

"Via-first" approach: before or after FEOL

"Via-last" approach: before or after bonding/thinning

METHOD FOR FABRICATING THROUGH SUBSTRATE VIAS

CROSS-REFERENCE TO RELATED APPLICATIONS

This application is a continuation of PCT Application No. PCT/EP2009/052922, filed Mar. 12, 2009, which claims priority under 35 U.S.C. §119(e) to U.S. provisional patent application 61/037,992 filed on Mar. 19, 2008. Each of the above applications is incorporated herein by reference in its entirety.

BACKGROUND OF THE INVENTION

1. Field of the Invention

The invention relates to the field of three-dimensional integration of integrated circuits. In particular, the present invention relates to methods for manufacturing a through substrate via in semiconductor chips, and to semiconductor chips prepared for being provided with and/or being provided with such through substrate vias.

2. Description of the Related Technology

The semiconductor industry has been able to steadily reduce the cost per function and to increase the function density in integrated circuits over the last three decades. At the same time, the different abstraction levels separating semiconductor design and manufacturing have enabled efficient product design cycles and fast time-to-market. However, economical and technical issues may slow down the scaling effort beyond the 32 nm node.

FIG. 1 shows a prior art example of a CMOS device with a substrate 5, comprising a front-end-of-line 1 comprising active devices, for example transistors. On top there is a back-end-of-line 3 comprising a multi-layer of metal/dielectric. The back-end-of-line 3 comprises different metal levels, e.g. Cu or Al, labelled from M1 to Mn and isolated from each other by means of interlayer dielectric layers 15, and contacts or vias, labelled Via 1 to Via n, interconnecting the different metal levels M1 to Mn through the interlayer dielectric layers 15. The (electrical) connection between the front-end-of-line 1 and the metal levels, in particular metal one M1, in the back-end-of-line 3 is made by means of contacts 2.

For many applications different ICs, for example with different functionalities are connected with each other. Therefore, connections are made between the back-end-of-line parts 3 of the different ICs that are to be connected. In case of ICs that are positioned next to each other, connecting the back-end-of-line parts 3 of the different ICs can be done with long wiring.

To keep on reducing the cost per function, one possibility is to move to a three-dimensional (3D) stacking of integrated circuits (ICs). In this approach, devices are stacked on top of each other rather than next to each other. This reduces significantly the area that is used for the ICs and permits to extend the number of functions per area of the integrated device or system when compared to non-stacked ICs. Using 3D chip stacking, it is possible to extend the number of functions per area of the integrated device or system well beyond the near-term capabilities of traditional scaling. 3D strata are the individual device layers that build up the 3D system. These layers can be processed separately to be stacked later in the process flow. The 3D strata may be realized using advanced CMOS technology nodes but may also exploit a wide variety of device technologies to optimize system performance. Such heterogeneous 3D stacks may include, or consist of, e.g. CMOS, BiCMOS, different memory technologies and even MEMS, integrated passive layers and optical components like for example GaN (III-V).

Different product applications may require different 3D-interconnect technology solutions. In 3D technology these may be interconnect technologies at the package level, wafer level and/or foundry level. 3D stacking and interconnection technologies are mainly limited to the assembly techniques that realize 3D-interconnects at the packaging interconnects level. Technologies for through substrate via (TSV) connections are only emerging and not widely available for volume manufacturing. Depending on their TSV diameter and pitch capabilities, these technologies principally target to enable 3D interconnectivity at the IC bond-pad and IP-block level, as well as at the global, intermediate or even local level of the interconnect hierarchy. TSVs can be applied to single layer semiconductor devices, but also to substrates, stacked semiconductor devices or substrates . . . .

In literature, a wide variety of TSV integration schemes has been proposed. Most of these integration schemes described in literature include:
- making of a deep hole in or through the substrate (typically using laser drilling, DRIE, . . . ),
- isolation of the hole using an insulator or dielectric material (typically $SiO_2$, SiN, polymers, . . . ),
- application of conductive material or metallization into the via hole (typically Cu, W, but also Al, Au, Sn, poly-Si, . . . ).

The TSV integration schemes can differ in terms of
- the type of the substrates (Si, SOI, . . . ),
- the position in the process flow for fabrication of the device where the TSV is processed (examples are before front-end-of-line (FEOL), after FEOL & before back-end-of-line (BEOL), after BEOL, after stacking, before/after thinning . . . ),
- the way in which devices or substrates are stacked on top of each other and the way in which the TSV is interconnected to the next level in the stack (Oxide/oxide stacking in combination with a metallic interconnect, conductive polymer adhesive, Cu/Cu metal fusion, solder (microbump), Hybrid metal/dielectric bond, . . . ),
- the side of the wafer from which the TSV hole is processed (Wafer/substrate front or wafer/substrate backside).

The side of the wafer from which the TSV hole is processed is a major differentiator in complexity when applying the process e.g. to semiconductor devices.

As the before, FIG. 1 shows an example of a regular CMOS stack built-up with a multi-layer metal/dielectric back-end-of-line 3.

Often, TSVs 10 are processed from the device top side during back-end-of-line processing as illustrated in FIG. 2. In that case the TSV hole is etched or drilled during or after back-end-of-line processing at least through (part of) the multilayer back-end-of-line 3 being a layered stack containing a variety of materials (such as for example metals e.g. Cu, Al, . . . and dielectrics e.g. oxides, nitrides, carbides, . . . ). After processing the hole through the BEOL 3 layers, it needs to be further deepened to extend through the pre-metal dielectric layer (PMD) 13 and into the substrate 5, e.g. silicon substrate. In view of the number of materials the hole needs to be drilled or etched through (at least metal layers, ILD layers, PMD layers, substrate), the process can be fairly complex as different etch chemistries may be necessary to etch the different materials. Furthermore deep holes result in a high aspect ratio, which is difficult to obtain via etching and filling. In order to contact the via from the back side of the wafer further processing typically includes thinning the wafer substrate until the conductive layer in the TSV 10 is exposed.

An example of TSVs 10 processed through BEOL and FEOL as in FIG. 2 can be found in parts 3 and 4 of FIG. 3, before and after bonding and thinning, respectively. This figure is taken from an article by Steve Lassig, "Manufacturing integration considerations of through-silicon via etching", in Solid State Technology, The international magazine for semiconductor manufacturing, December 2007.

In an alternative approach, via holes are etched or drilled from the wafer backside after first thinning the substrate (Proceedings of the 57th Electronic Components and Technology Conference, p 643). This approach is shown in FIG. 4. In this case the stack through which the hole needs to penetrate is considerably simpler and typically includes, or only consists of, the substrate 5, e.g. Si, and a dielectric stack 14, 13. An advantageous feature of this process flow is that it is much less dependent on the details of the stack built up on the front side of the wafer. The process therefore is much more generic and can be applied to a wide variety of devices. Implementation schemes for this approach will typically show vias landing on a metal pad, e.g. a Cu or Al metal pad, in the metal one M1 layer. A disadvantage of this approach is the fact that the etching of the TSVs stops in metal thereby increasing the risk of metal contamination of the tools. A further disadvantage is that an etch through the dielectric stack is needed, which is difficult if one does not know the stack, hence does not know the chemistry needed. This is an issue in particular when wafers have to be stacked which do not come from in-house or come from different sources/fabs.

SUMMARY OF CERTAIN INVENTIVE ASPECTS

Certain inventive aspects relate to good methods and devices for stacking chips one onto another.

In a first aspect, the present invention relates to a method for fabricating through substrate vias, also called through wafer vias, thereby solving problems from prior-art. Such through substrate vias can be manufactured at the fab where the FEOL devices are manufactured, or at another location, for example where the chip is stacked onto another chip, and/or where the chip is packaged.

According to embodiments of the present invention, a method is provided for manufacturing a through substrate via in a semiconductor chip, the chip comprising a substrate, a FEOL comprising at least one device of the chip, a BEOL comprising a metal one layer, a pre-metal dielectric between the substrate and the metal one layer of the BEOL, at least one first contact to the at least one device of the chip and at least one second contact plug not contacting the devices, the first and second contact plugs being provided through the pre-metal dielectric and electrically connecting the metal one layer. The method comprises providing a via hole through the substrate, the via hole not extending up to the metal one layer of the BEOL, and filling the via hole with conductive material such that electrical contact with the metal one layer is realized via the at least one second contact plug in the pre-metal dielectric. Providing a via not extending up to the metal one layer of the BEOL means providing a via hole through the substrate, optionally also partially through the pre-metal dielectric, but not up to the metal one layer.

It is an advantage of certain inventive aspects that provision of the stack is easier than in prior art, as only a limited number of materials need to be removed. In the most easy case, only substrate material, optionally comprising a doped portion, needs to be removed, thus reducing the etch chemistries needed to one. In other embodiments, only substrate material and a dielectric material, e.g. shallow trench isolation (STI), need to be removed. This is a fairly simple process, and it is relatively easy to get to know which etch chemistries to use. In yet another embodiment, besides substrate material and optionally dielectric material, e.g. STI, also a portion of the pre-metal dielectric is removed.

According to embodiments of the present invention, the method may furthermore comprise providing the at least one second contact plug in the pre-metal dielectric. According to alternative embodiments, the method does not include this provision of the at least one second contact plug, and the at least one second contact plug has been provided by someone else, e.g. by the manufacturer of the BEOL which is different from the manufacturer of the through substrate via. Providing the at least one second contact plug may be performed as part of BEOL processing. The at least one second contact plug may be provided at the same time as providing the at least one first contact to the at least one FEOL device. Alternatively, the at least one second contact plug may be provided in a separate processing step, e.g. before or after provision of the at least one first contact. The at least one second contact plug is strategically placed at a location where a through substrate via is to be provided, and will serve in providing an electrical connection between the metal one layer and the actual through substrate via.

A method according to embodiments of the present invention may further comprise forming a silicided area in the substrate underneath and in electrical contact with the at least one second contact plug. Practically this may be obtained by first providing the silicided area, e.g. during FEOL processing, and thereafter, e.g. during BEOL processing, providing the at least one second contact plug through the pre-metal dielectric and in electrical contact with the silicided area. A silicided area is particularly well suited for making electrical contact to the at least one second contact plug. A method according to embodiments of the present invention may further comprise forming a diode at the location of the silicided area, the diode comprising the silicided area. This diode does not form part of the FEOL devices of the chip; it is not a device required for the functioning of the chip, it is a device provided for enabling contacting of the chip. The FEOL devices are those devices, active and/or passive, which are provided in the design of the chip to allow the chip to perform the function as desired.

In a method according to embodiments of the present invention, the substrate may have a front side which is a main surface where devices are provided and a backside which is a main surface opposite thereto, and providing a via hole may be performed from the backside of the substrate. This has the advantage that the stack to be removed, e.g. by etching, is much simpler than when removing material from the front side of the surface, upon which the BEOL is provided, which may be a complicated stack.

In methods according to embodiments of the present invention, providing a via hole may comprise providing the via hole after BEOL processing. In methods according to embodiments of the present invention, providing a via hole may comprise providing a via hole before stacking the chip onto and electrically connecting the chip with another chip.

A method according to embodiments of the present invention, may furthermore comprise thinning the substrate before providing the via hole. This has the advantage that the via hole to be provided needs to be less deep, hence there are less issues with aspect ratio and filling of deep holes.

In a particular method embodiment of the present invention, the following could be provided:

A method for fabricating through substrate vias (TSVs), the method comprising a) selecting a semiconductor wafer, e.g. a silicon wafer; b) fabricating ICs, comprising front-endof-line processing and back-end-of-line processing at a first side of the semiconductor wafer; c) after fabricating ICs, thinning the semiconductor wafer at a second side of the wafer, the second side being essentially parallel to the first side of the wafer; d) after thinning the wafer, fabricating, through-substrate via holes at the second side, whereby the through substrate via holes are penetrating down to the contact level; e) filling the through substrate via holes with a conductive material; f) fabricating at least one second contact at one side in electrical contact with a metal bond pad interconnecting the at least one second contact and at the other side in electrical contact with a TSV; and g) integrating the metal bond pads in electrical wiring in back-end-of-line processing.

In embodiments of the present invention, the conductive material for filling the through substrate via holes may be Cu. A barrier layer such as for example a Ta/TaN barrier layer can be used.

In an alternative embodiment, the conductive material for filling the through substrate via holes may be W. A barrier layer such as for example a Ti/TiN barrier layer can be used.

In a second aspect, the present invention provides a semiconductor chip comprising a substrate with at least one FEOL device, a BEOL comprising metal pads, e.g. metal one pads, first contacts contacting the at least one FEOL device and at least one second contact plug underneath a metal pad, e.g. metal one pad, and in electrical contact therewith, wherein the at least one second contact plug at one extremity contact and electrically connect to the metal pad, e.g. metal one pad, and at another extremity contact material not part of an FEOL device, e.g. dielectric material, substrate or conductive material not part of a FEOL device. With "underneath the metal pad" is meant between the metal pad and the substrate of the chip. The directions "under" and "above" or "on top of" are defined here for the sake of clarity only, referring to the substrate being "under" and the FEOL and BEOL being "above", the BEOL being "at the top" of the chip. These directions do not relate or refer in any way to the actual position of the chip, which may be used or connected to another chip in e.g. top down position. "Conductive material not part of a FEOL device" may for example be a silicided region as explained below, provided explicitly for making electrical contact between the through substrate via to be formed and the at least one second contact plug and not having to do with the actual function of the chip.

In a semiconductor chip according to embodiments of the present invention, the at least one second contact plug may extend through a pre-metal dielectric layer between the FEOL and the metal pads, e.g. metal one pads, of the BEOL.

In a semiconductor chip according to embodiments of the present invention, the at least one second contact plug may be in electrical contact with a silicide at a side opposite to the side in electrical contact with the metal pad. If the "another extremity of the at least one second contact plug" contacts a silicided area, the semiconductor chip may further comprise a diode at the location of the silicided area.

A semiconductor chip according to embodiments of the present invention may furthermore comprise a through substrate via in electrical contact with the at least one second contact plug. In embodiments of the present invention, the semiconductor chip may comprise a pre-metal dielectric layer between the FEOL and the BEOL, wherein the through substrate via does not penetrate the pre-metal dielectric layer. In alternative embodiments of the present invention, the semiconductor chip may comprise a pre-metal dielectric layer between the FEOL and the BEOL, wherein the through substrate via only partially penetrates the pre-metal dielectric layer, hence does not penetrate the pre-metal dielectric layer up to a metal layer, e.g. metal one layer, of the BEOL.

In embodiments of the present invention, the through substrate via goes through only part of the BEOL.

A semiconductor chip according to embodiments of the present invention may further comprise a silicided area underneath the at least one second contact plug, the silicided area being in electrical contact with the at least one second contact plug and the through substrate via.

Certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Figure 1:
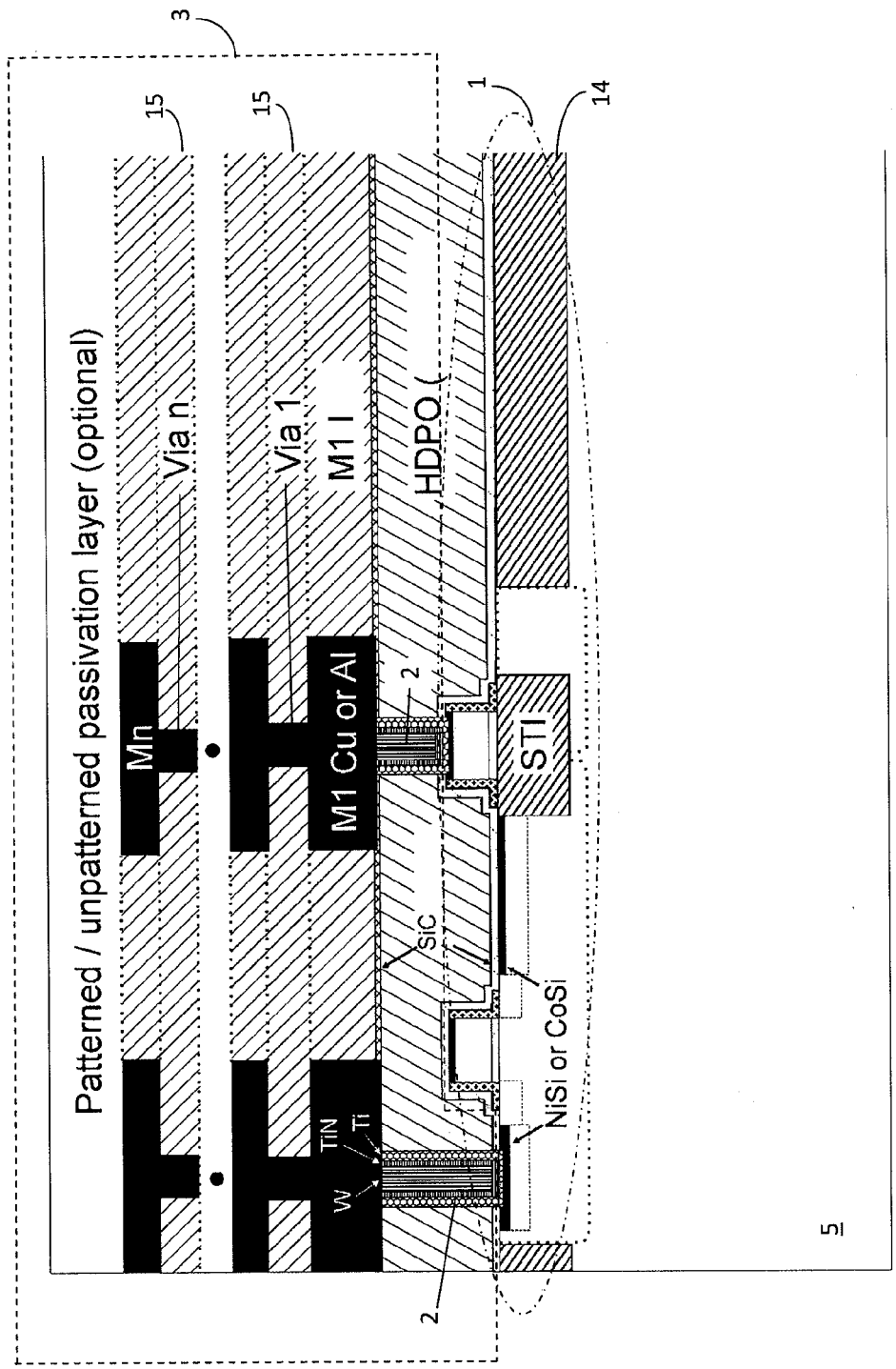
FIG. 1 shows an example of a regular CMOS layer build up as known in the art.
Figure 2:
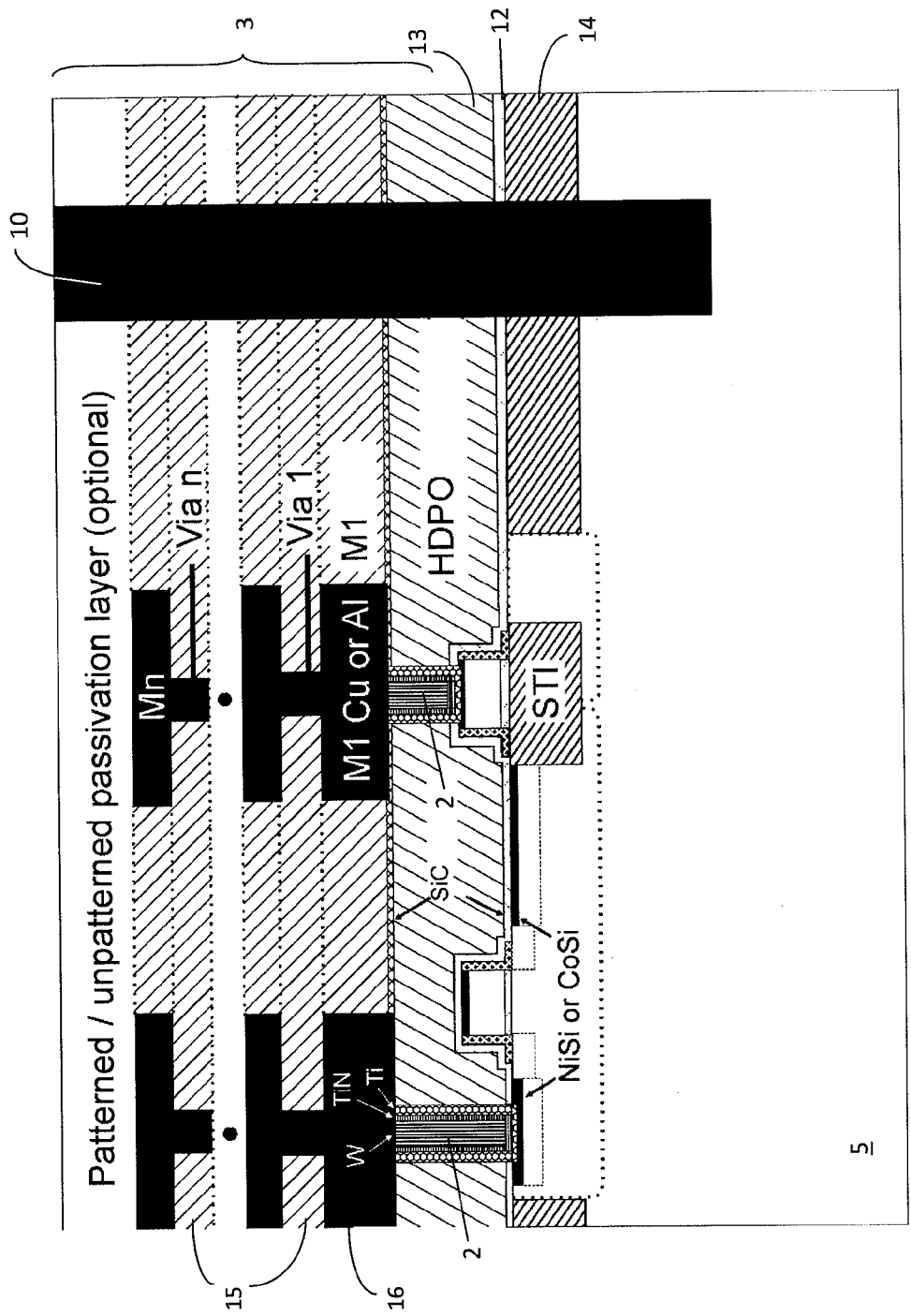
FIG. 2 illustrates an example of a TSV hole processed from the device top side according to a prior art method.
Figure 3:
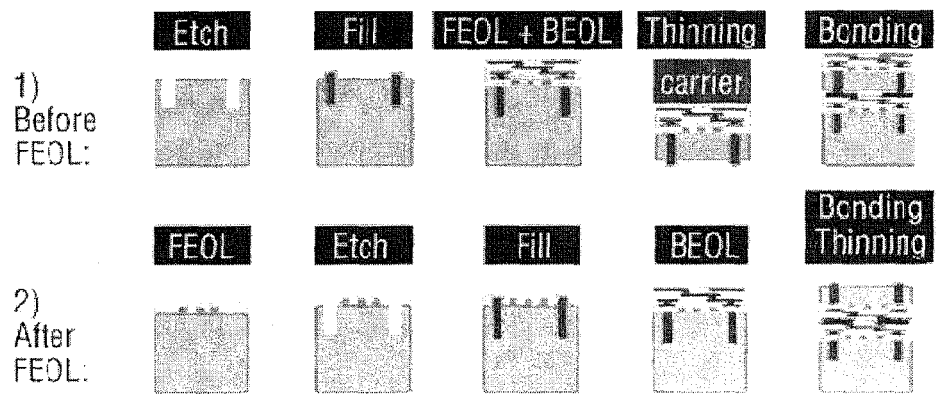
FIG. 3 illustrates prior art methods for manufacturing vias for 3D stacking; the first method is to provide the vias before FEOL processing, the second method is to provide the vias after FEOL but before processing BEOL, the third method is to provide vias after FEOL and BEOL processing but before stacking wafers, and the fourth method is to provide vias after FEOL and BEOL processing and after stacking of the wafers.
Figure 3:
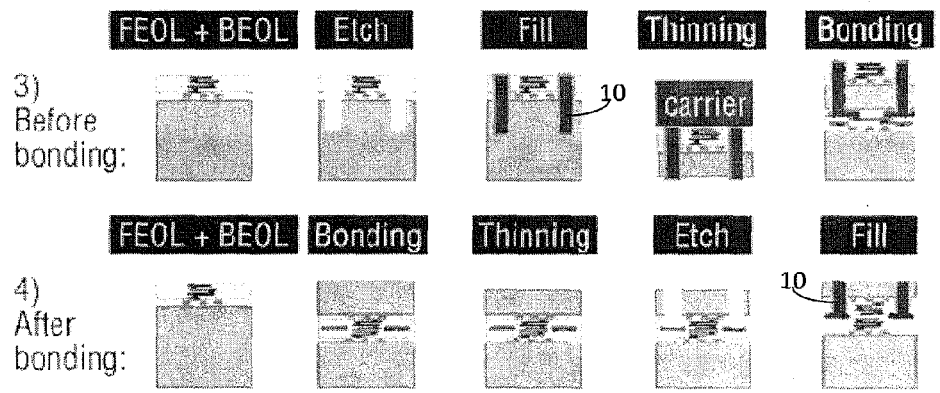
Figure 4:
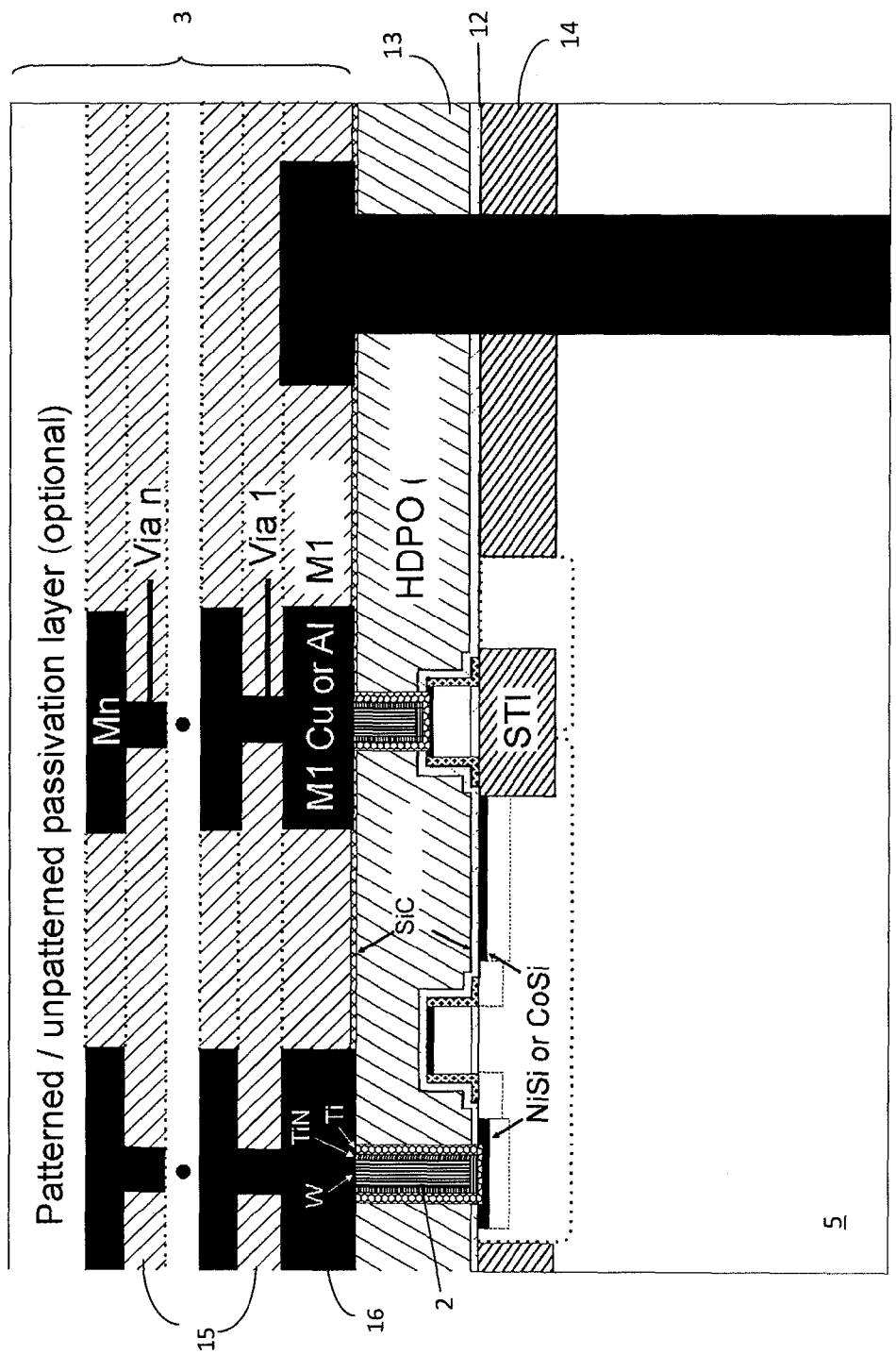
FIG. 4 illustrates an example of a TSV hole processed from the device back side according to a prior art method.

Dimensions in the drawings may be exaggerated and not to scale for clarity reasons.

Materials mentioned in the drawings are for the purpose of illustration only, and are not intended to limit the invention in any way.

DETAILED DESCRIPTION OF CERTAIN ILLUSTRATIVE EMBODIMENTS

The active parts of devices, for example transistors etc. in case of CMOS devices, are called front-end-of-line (FEOL) part 1 or frontend of the devices. Processing of this part is called FEOL processing.

These active devices are connected to each other with electrical wiring which is often called back-end-of-line (BEOL) 3 or backend. Processing of this part is called BEOL processing.

Connection between the FEOL and BEOL is made by first contacts or vias 2. In this case first contacts and vias are also classified as being part of BEOL 3.

The front-side of a substrate 5 is the side where the active devices of a chip 11 are located. The bottom is the side opposite to the side where the active devices are located. In the following, through substrate vias (TSVs) are filled holes (often filled with a conductive material) down to the bottom of the substrate 5. At the front side of the devices they can be covered with layers or interconnects. At the other side, the vias can be contacted, for example to contact other devices. This means that TSVs according to embodiments of the present invention are going through at least part of the BEOL 3, through the full FEOL 1 and through the rest of the wafer, at least the substrate 5, underneath BEOL 3 and FEOL 1.

In a first aspect of the present invention, a method 80 (see FIG. 8) is provided for manufacturing through substrate vias (TSVs) 75. The method comprises, after front-end-of-line processing 82, covering the FEOL devices 1 with a pre-metal dielectric 13, comprising one or more dielectric layers, providing first contact plugs 2 for connecting the BEOL to the FEOL devices 1, and providing 85 at least one second contact plug 50 through the pre-metal dielectric 13 at a location where a TSV is to land. Such providing 85 of second contact plugs 50 may be done at the same time of providing 84 first contacts 2 for electrically connecting the FEOL 1 to the BEOL 3. Thereafter, normal BEOL processing may be carried out—step 86 in the flow chart of FIG. 8.

Process steps for carrying out the above method are known to a person skilled in the art, as they are not different from processing steps in standard semiconductor processing. The only part which is different, though, although not in processing in itself but in the idea behind it, is the provision 85 of the at least one second contact plug 50, e.g. array of second contact plugs 50, at a location where a TSV 75 is to land.

Figure 8:
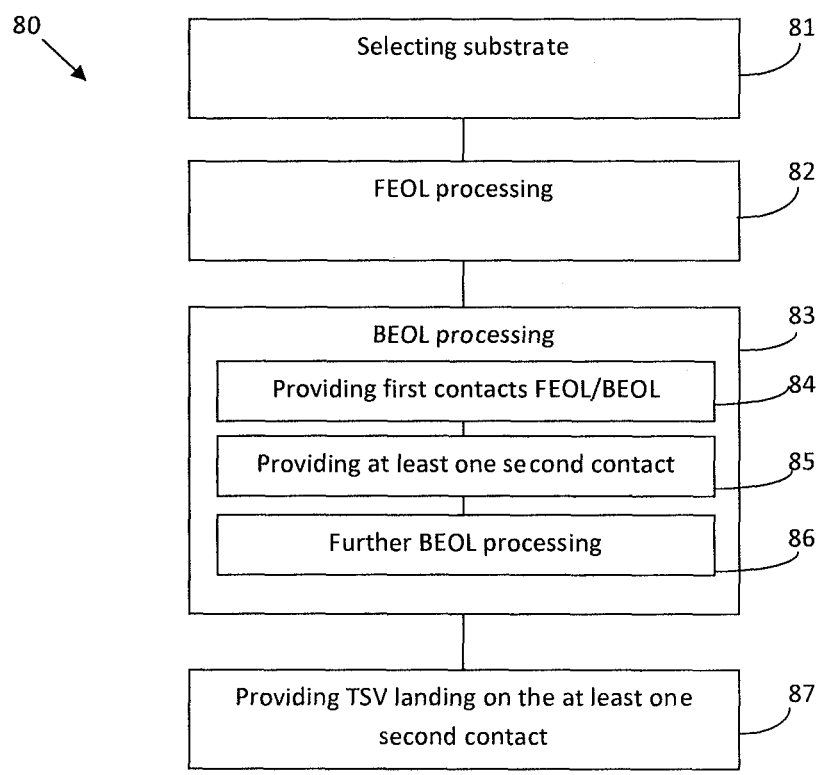
FIG. 8 is a schematic overview of a process flow for methods in one embodiment.

Thereafter, according to the first aspect of the present invention, at least one TSV is provided—step 87 of the flow chart in FIG. 8. In embodiments of the present invention, such through substrate vias (TSVs) are processed from the wafer backside, ultimately stopping on the second contact plugs 50.

In embodiments of the present invention, the vias 75 do not go through PMD 13, or any IMD layer 15 or back-end-of-line layer. In particular embodiments of the present invention, the vias 75 do not even go through FEOL STI. This is realized by strategically providing the second contact plugs 50 and etching the vias from the wafer backside until the bottom of the second contact plugs 50 is reached.

An advantage of this approach is the fact that via hole drilling/etching through the PMD and possibly also through the STI area can be avoided. This reduces the number of layers and different materials that are etched and results in a simplified drilling/etching process. This enhances applicability of the process to a larger variety of devices making the process more suitable for outsourcing to e.g. a packaging house, where one does not need to know the actual composition of the layers—only the type of substrate needs to be known.

Also the cost of the process is reduced compared to prior art methods. In the original existing process flows, where through wafer vias are etched from the wafer front side after finalizing front-end-of-line processing, the via etching process needs to be segmented into different steps for each material that needs to be etched. In an approach according to embodiments of the present invention the number of different materials that need to be removed during hole fabrication is reduced.

As the vias stop on second contact plugs 50 fabricated during IC processing, there is no extra cost for processing additional contact plugs as this can be integrated in the contact processing.

Another advantage is the fact that via etching according to embodiments of the present invention does not stop on a metal layer or pad, in particular not on the metal one layer 16. As, according to embodiments of the present invention, the TSVs stop in second contact plugs 50, they stop on a small metal area (rather than in large metal pads of, for example, metal one 16), which reduces the risk of metal contamination of etching tools and other equipment used in further process steps (for example cleaning, deposition, . . . ). When etching the TSV from the backside, over-etch (slightly larger etch time than strictly needed to fully etch the vias) may be used, both in prior art and in embodiments of the present invention, in order to compensate for etch non-uniformities or wafer non-uniformities (wafer-to-wafer and within wafer). For certain parts of the wafer or certain wafers, this implies that the underlying metal may be exposed to the etching chemistry; e.g. etching plasma, for a considerable time. In prior art methods, this increases the level of metal contamination in the etch chamber. By landing on a contact layer as in accordance with embodiments of the present invention, the amount of metal exposed during plasma etch is significantly reduced. Also the amount of metal exposed in further process steps is reduced, thereby reducing the risk/level of metal contamination in tools used for further processing (for example cleaning tools, deposition tools, . . . ). As there is less risk for contamination during etching, one can more easily allow for overetching and the etch time becomes less critical. Hence, a process according to embodiments of the present invention is more robust to local variation in thickness of the wafer, e.g. Si wafer, for example after thinning.

Also contamination issues appearing in the prior art methods, originating from etching until a metal layer (e.g. Cu) is reached can lead to a drift of the etch process. This drift in the etch processes can be limited in accordance with embodiments of the present invention by etching down to contacts instead of large metal bond pads.

Etching down to contacts in accordance with embodiments of the present invention also reduces the risk of notching. Notching is an undercut effect that occurs at the bottom of the via (where the via hits the metal), mainly due to plasma non-uniformities at the bottom of the via.

Also, different metals may behave differently: for example W is often used in contact plugs, instead of Cu which is often used for metal levels. A metal can be chosen for the contacts that is less contaminating for the etch tools (for example less affects stability of the etch tool or etching time) and other tools for further processing than the metal which is used for the metal pads in the BEOL processing.

The fabrication in accordance with embodiments of the present invention can be done as described below.

First the front-end-of-line of the ICs is processed. This is not described in detail as it is not crucial for certain embodiments. It includes manufacturing of a number of active and/or passive devices as required by the integrated circuit to be manufactured. The front-end-of-line manufacturing includes a plurality of loops, each putting down a layer on the device, and comprising some or all of the steps of deposition, photolithography, diffusion, ion implantation, etching, stripping, chemical mechanical planarization. The only part of front-end-of-line processing which is important with respect to certain embodiments is manufacturing of contacts.

At the contact level, according to embodiments of the present invention, not only first type contacts for contacting FEOL devices 1 to BEOL 3 are provided, but extra second type contacts for contacting the TSVs are made, also called second contacts or second contact plugs hereinafter. This is illustrated for different embodiments in FIG. 5(a), FIG. 5(b) and FIG. 5(c).

For contacting the circuits with the TSVs to be manufactured, one or more second contact plugs 50 or arrays of second contact plugs 50 are fabricated underneath metal 1 pads 55 where the TSVs will land on and which metal 1 pads 55 are connected to these circuits. The second contact plugs 50 are made through the pre-metal dielectric 13. The metal 1 pads 55 can have a size which in one dimension is approximately varying between 1 µm and 500 µm, or between 20 µm and 150 µm, or between 3 µm and 15 µm, 3 µm and 10 µm; for example a size of 50 µm×50 µm. The diameter of the second contact plugs 50 can vary between 15 nm and 1000 nm, between 20 nm and 500 nm, or 25 nm and 150 nm, or between 30 nm and 100 nm. The distance between the second contact plugs 50 can vary approximately between 15 nm and 1000 nm, between 20 nm and 500 nm, or 22 nm and 130 nm, or between 30 nm and 100 nm. The pitch between the second contact plugs 50 can vary between 30 nm and 2000 nm or between 40 nm and 1000 nm, between 44 nm and 260 nm, between 47 nm and 280 nm, between 50 nm and 300 nm, between 55 nm and 400 nm, between 60 nm and 200 nm. The size and the number of second contact plugs 50 underneath a single metal pad 55 and in electrical contact with the TSV 75 define the current that can run through the via. The larger the second contact plugs 50 and the higher the number of second contact plugs 50 the higher the current that can run through the via 75. So the minimum number of second contact plugs 50 can be defined based on the required current and the size of the second contact plugs 50. The number of second contact plugs 50 underneath a metal 1 pad 55 can vary between 1 and 10000 or between 2 and 500 or between 5 and 100, or between 10 and 64 or between 5 and 5000 or between 10 and 1000 or between 50 and 500 or between 100 and 200. In order to circumvent failing second contact plugs 50, the number of second contact plugs 50 is preferably higher than 1, for example equal to or higher than 2, or equal to or higher than 4. In case the second contact plugs 50 are connected to a large metal bond pad 55, the number of second contact plugs 50 is preferably high such as to limit the influence of failing second contact plugs 50 and to leave the possibility open of using high currents. The second contact plugs 50 can be arranged in a random way or in an array; the array may be circular or square; the array may be regular or irregular; the second contact plugs 50 may be made at equal or different distances from each other. In particular embodiments, the array may comprise a plurality of second contact plugs 50, wherein the number of second contact plugs 50 is optimized for conductivity reasons.

Figure 5A:
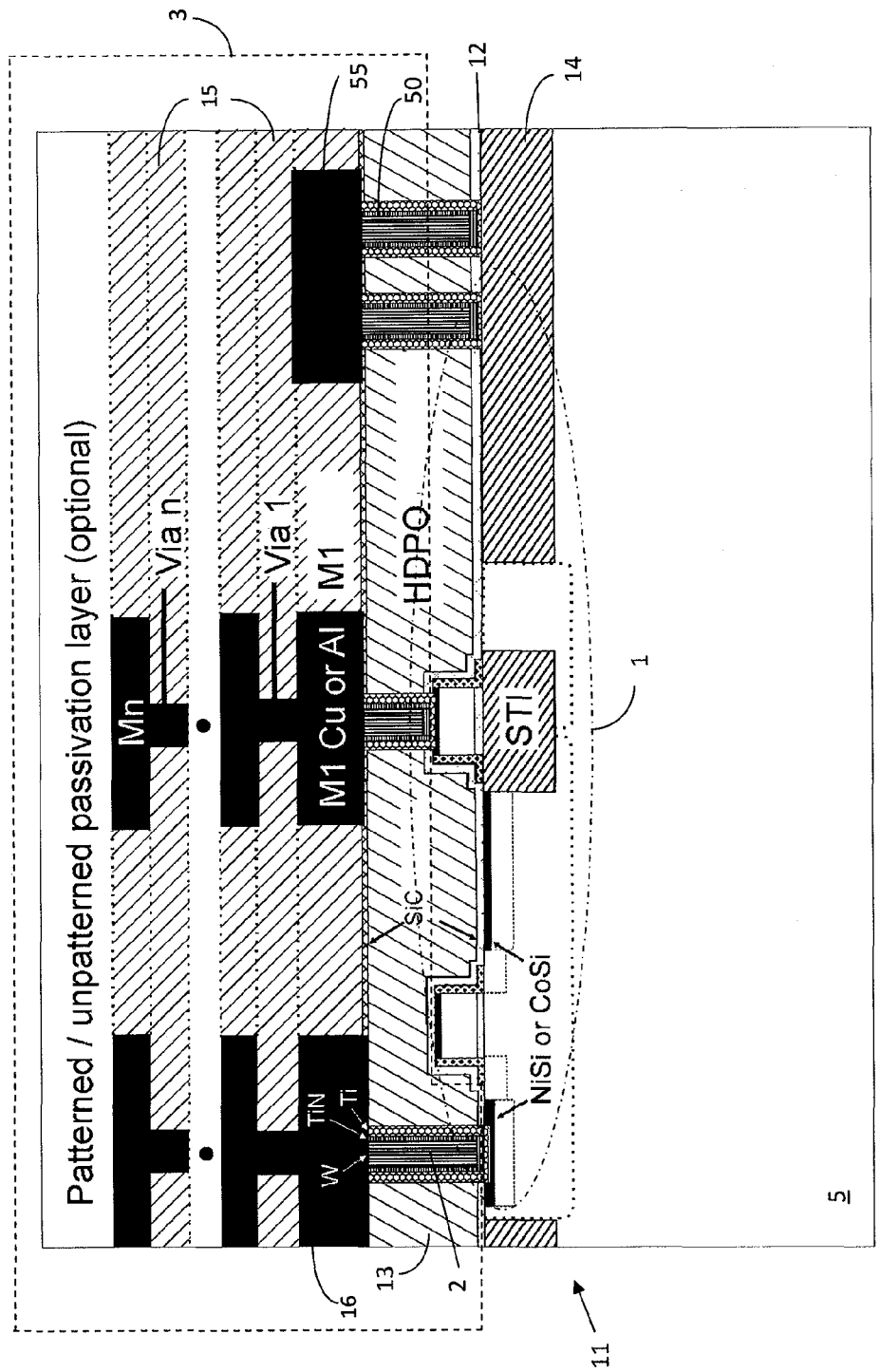
FIG. 5(a) illustrates an example of a device with prefabricated second contact plugs to land the TSV on in accordance with an embodiment of the present invention, wherein the second contact plugs are provided through a pre-metal dielectric.

In embodiments of the present invention, the second contact plugs 50 can extend up to the STI area 14 (FIG. 5(a)). This case is universally applicable. The depth of these plugs 50 can vary between 50 nm and 1000 nm, between 70 nm and 700 nm, between 100 nm and 550 nm in case of second contact plugs landing on STI 14.

Figure 5B:
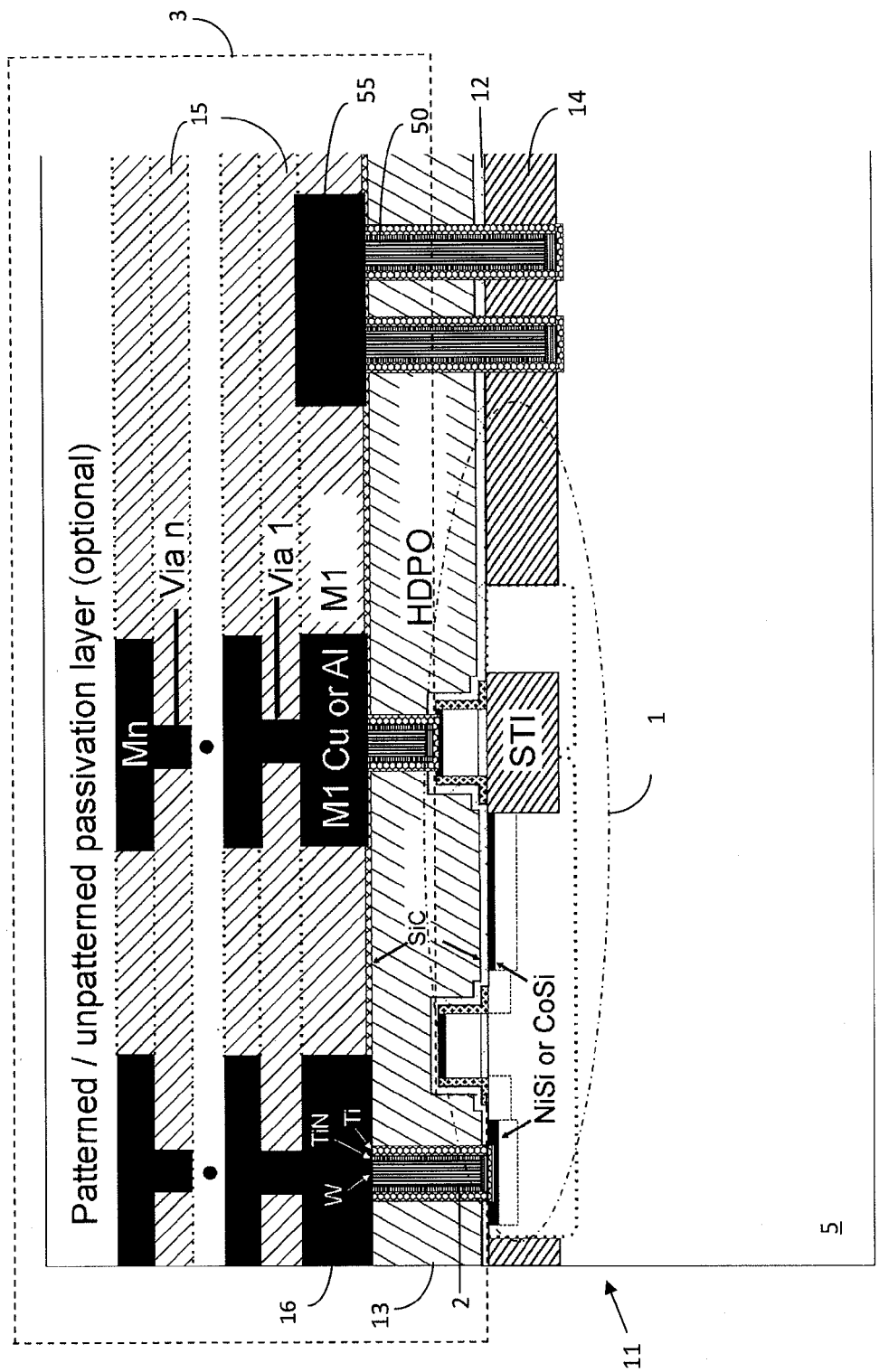
FIG. 5(b) illustrates an example of a device with prefabricated second contact plugs to land the TSV on in accordance with a second embodiment of the present invention, wherein the second contact plugs are provided through a pre-metal dielectric and an underlying isolation zone (e.g. shallow trench isolation STI).

In alternative embodiments, the second contact plugs 50 may even go through an isolation zone underlying a pre-metal dielectric, e.g. an STI area 14, into the substrate 5, e.g. Si substrate (FIG. 5(b)). Second contact plugs down to the substrate, e.g. silicon, are typically 20-100 nm (the thickness of the isolation zone, e.g. STI region) deeper than second contact plugs 50 to the isolation zone, e.g. STI 14. This embodiment optimizes the further process of providing the TSV landing on the second contact plugs 50, as less issues relating to the provision of the contact hole 60 remain (only substrate material present), but it may require a change in the facility process, as an etch of insulating material, e.g. an STI etch, at the moment of making the second contact plugs may not be part of the typical process flows or may be difficult and not controlled if performed over undefined Si areas.

Figure 5C:
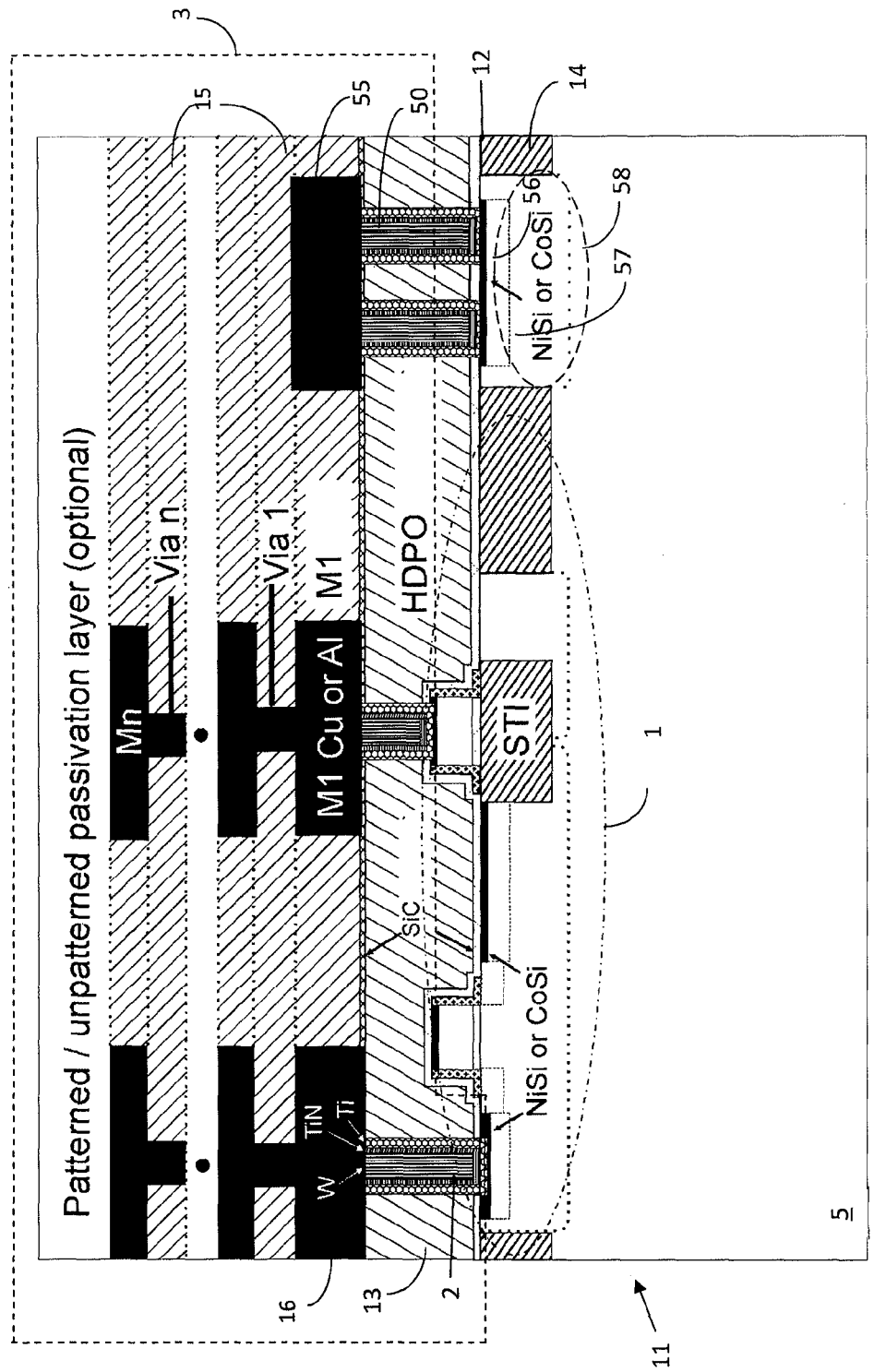
FIG. 5(c) illustrates an example of a device with prefabricated second contact plugs and Silicide and implantation to land the TSV on in accordance with a third embodiment of the present invention.

In yet alternative embodiments (as illustrated in FIG. 5(c)), the second contact plugs 50 can extend down to a silicide 56 and an implantation region 57 which are provided in the substrate 5.

If the second contact plugs 50 are touching the substrate 5, which may be the case in some embodiments of the present invention, once the front side processing is completed, it will be challenging, difficult or even impossible to verify the functionality of the chip 11 without further processing, i.e. without the actual TSV processing, since all the pads 55 for landing TSVs 75 would be shorted to the substrate 5. Even at design level difficulties may occur since the second contact plugs 50 are considered a design rule violation by standard EDA tools and foundry tool-kits if placed over undefined substrate, e.g. Si, areas.

These problems are overcome by a proposed method according to embodiments of the present invention. The proposed method is applicable to any CMOS technology and allows for a better testability of the devices. During the IC design, the locations of the TSV connections are designed as reverse biased diodes 58. These diodes 58 comprise p and/or n doped regions 57 and silicided contacts 56. These are contacted to the metal back-end layers, e.g. to a metal pad 55, typically using a contact process, e.g. W-plug contact process. After processing, the IC can be tested using standard techniques. The diodes 58 at the TSV location only add a small leakage current of the diodes to the circuit, not unlike the ESD protection structures that are also present.

Figure 6A:
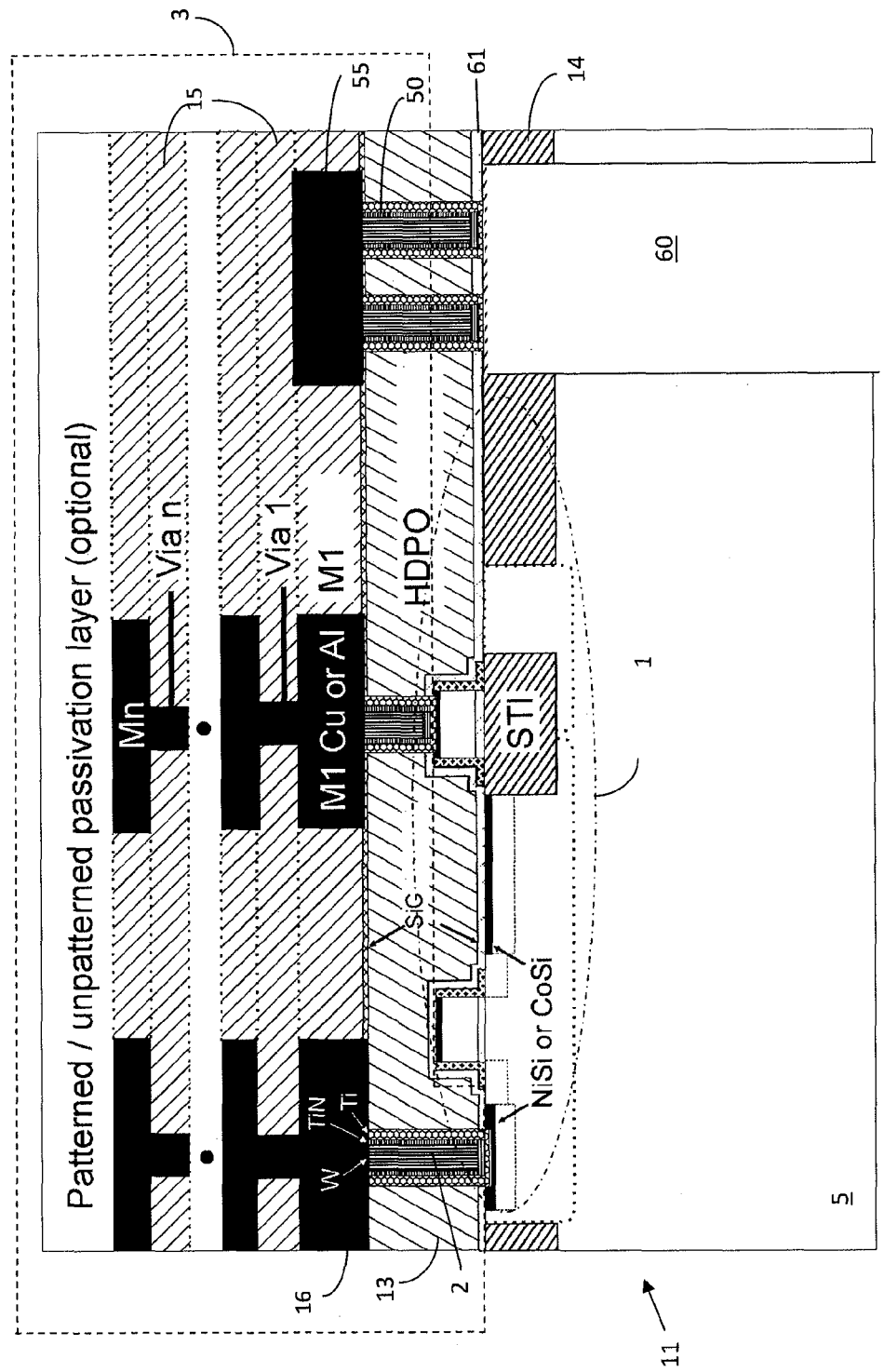
FIG. 6(a), FIG. 6(b), FIG. 6(c) and FIG. 6(d) illustrate different embodiments of a device with prefabricated second contact plugs with a via hole landing on the second contact plugs.
Figure 6B:
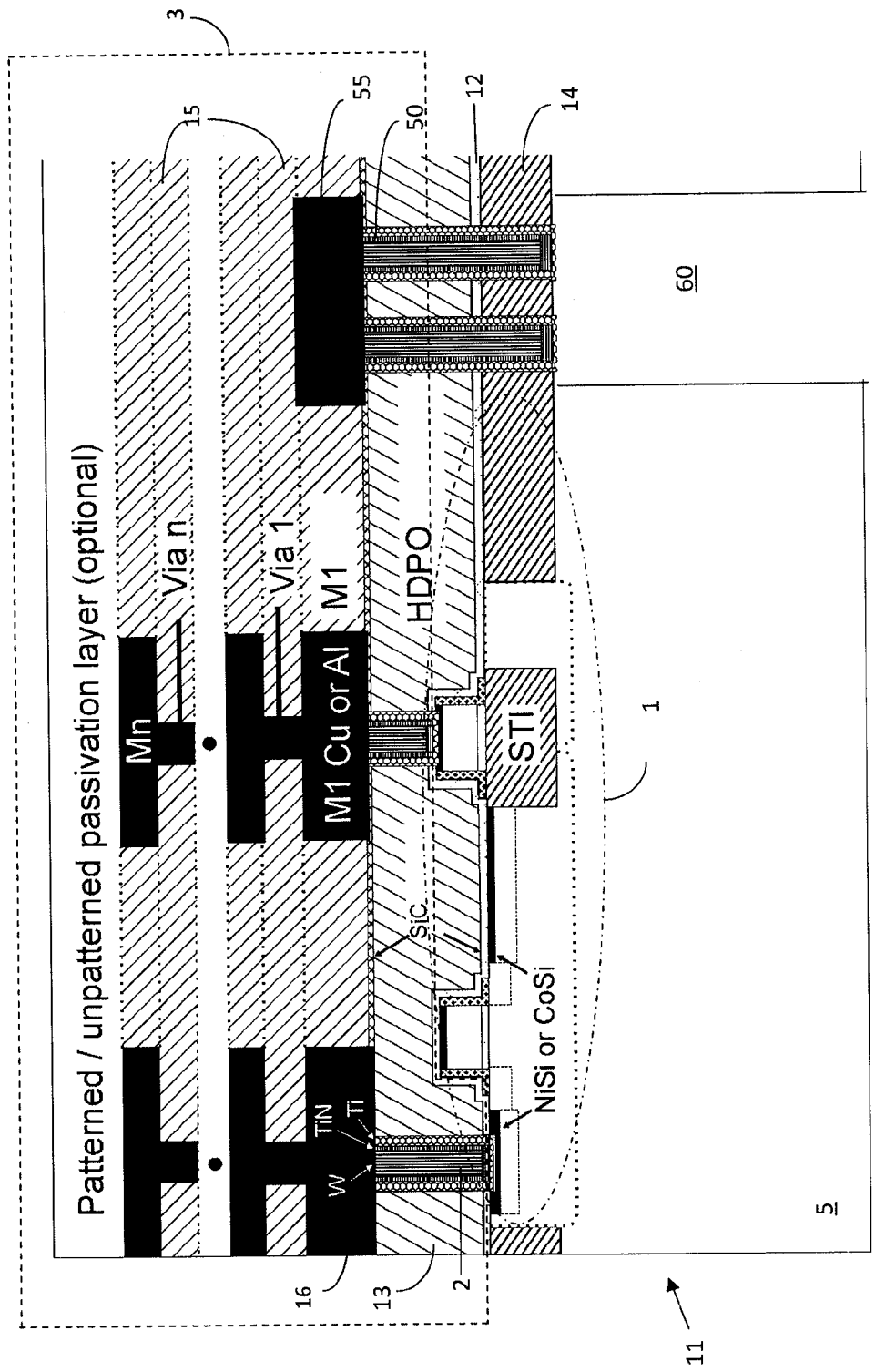
Figure 6C:
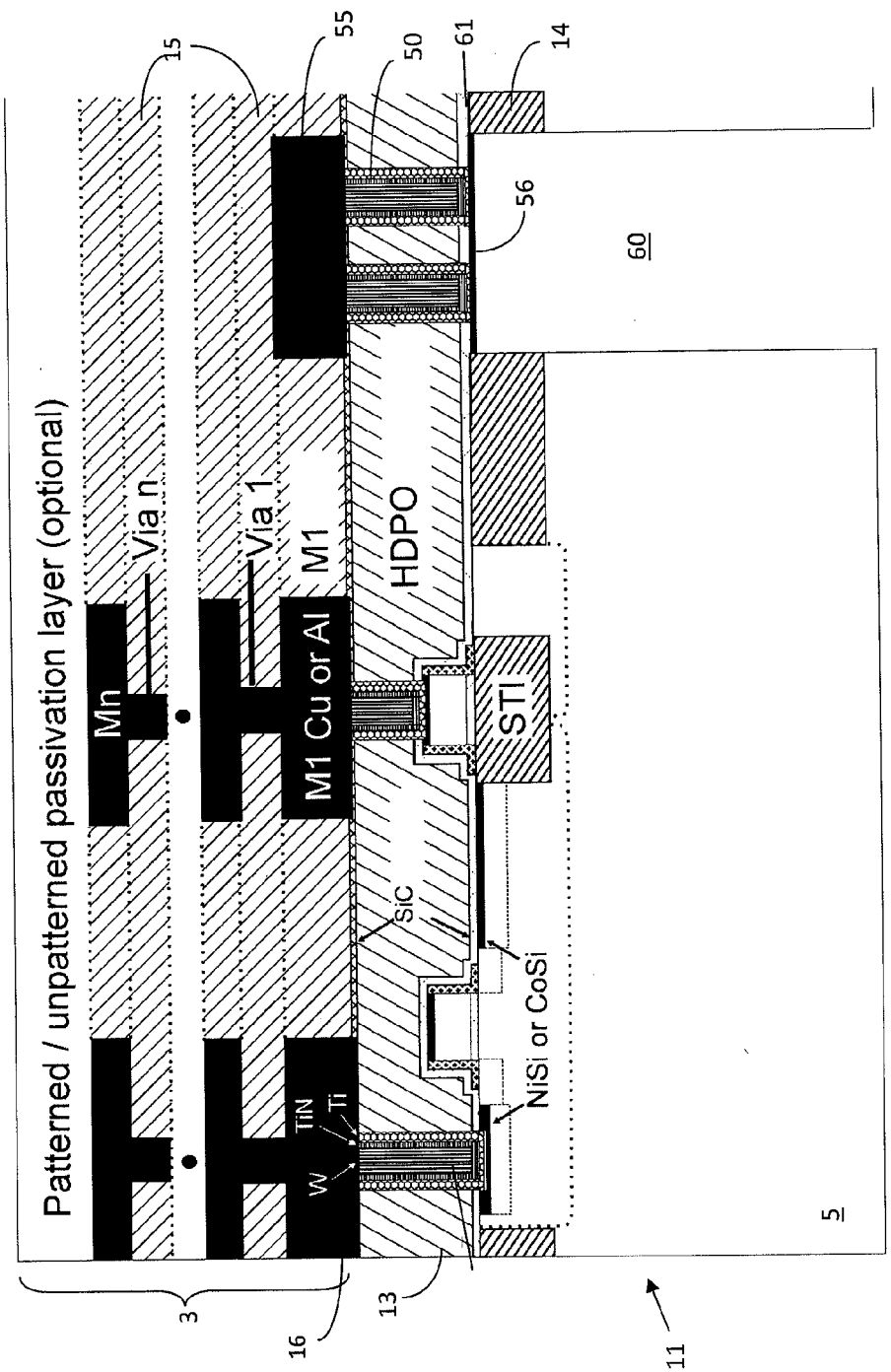
Figure 7:
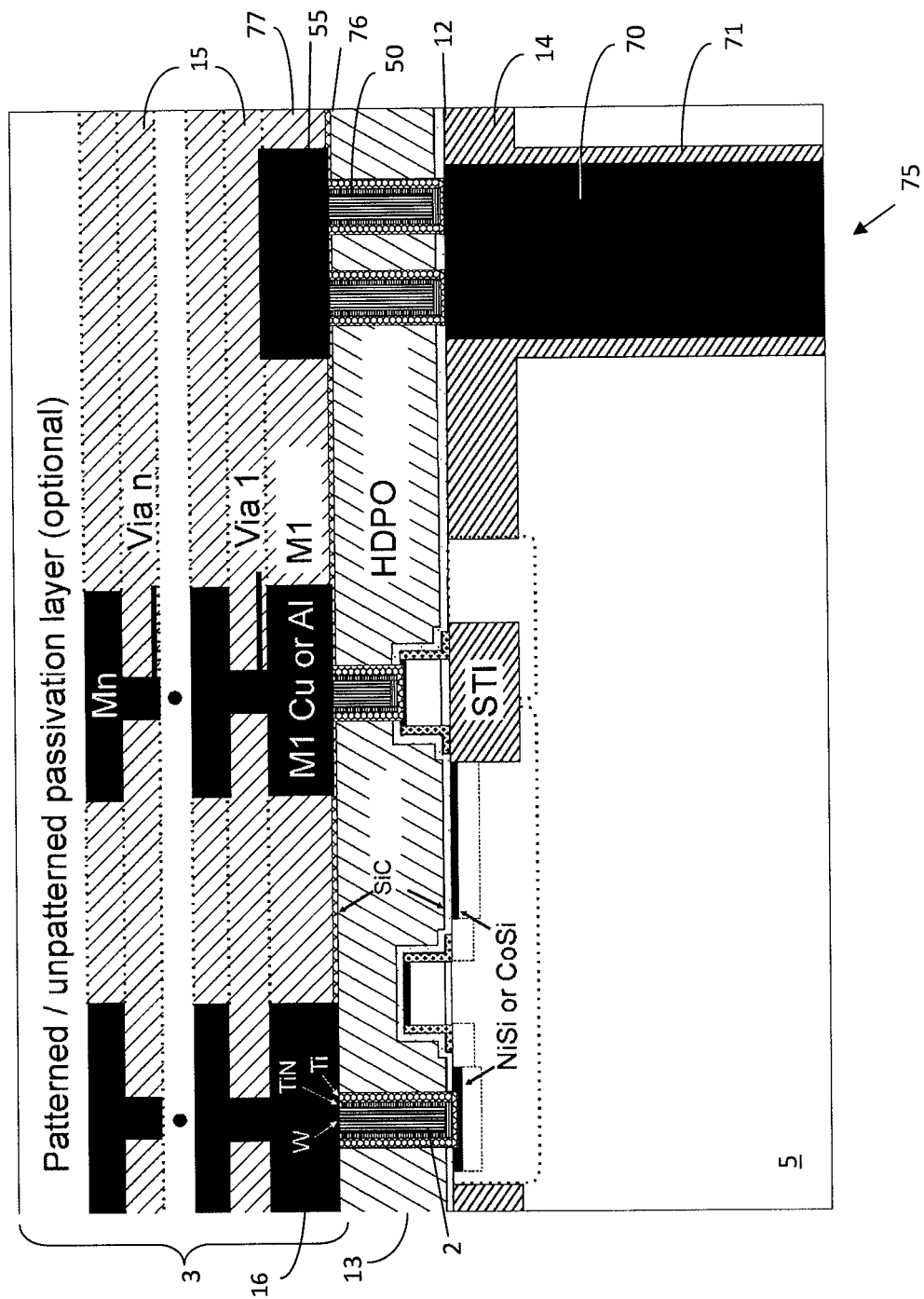
FIG. 7 illustrates a device with prefabricated second contact plugs according to embodiments of the present invention, with a filled via hole landing on the second contact plugs.

During TSV backside processing, substrate via holes 60, e.g. Si-via holes, are etched from the wafer backside to the contact area which removes the substrate material, including any p or n doped regions 57 from the TSV locations, but not the silicided contacts 56, as illustrated in FIG. 6(c). These layers 56 will resist further etching and protect the back-end interconnect and isolation layers. The subsequent TSV processes (as illustrated in FIG. 7) will deposit an electrical contact to these silicided contacts 56, practically completing the 3D-TSV contact 75.

For some 3D-TSV contacts not contacted to any particular part of the circuitry (e.g. TSV's connects from a top tier die to a lower tier die) or not contacted to substrate diodes, the presence of the sacrificial diode 58 at the TSV location can be used to test the contact to the TSV area.

In particular cases the extra second contact plugs 50 provided according to embodiments of the present invention can be fabricated together with the first contacts 2 to the front-end-of-line 1, so without the need of extra process steps. Alternatively, these extra second contact plugs 50 can be fabricated in a separate process step.

Providing, e.g. etching, of the holes to manufacture the second contact plugs 50 can be done by any suitable method, for example by lithography followed by dry and/or wet etching. Second contact plugs 50 can be made of W, Cu, polysilicon, Al, Ni, or any other suitable material used in the field, i.e. the holes provided can be filled with such conductive material.

After providing the second contact plugs 50, thinning the wafer from the backside to the desired thickness can be done (optionally) using suitable techniques such as grinding, CMP, wet or dry etching, or any other method used in the field. The desired thickness of the substrate 5 can vary between 5 µm and 800 µm, between 5 µm and 500 µm, between 10 µm and 500 µm, between 10 µm and 300 µm, between 10 µm and 200 µm, between 15 µm and 200 µm, between 20 µm and 100 µm.

Subsequently, after providing the second contact plugs 50, the TSV holes 60 are provided, for example etched, from the wafer backside, as illustrated in FIG. 6(a) to FIG. 6(d). The diameter of the TSV holes 60 can vary between 500 nm and 500 µm, between 1 µm and 120 µm between 1 µm and 100 µm, between 1 µm and 5 µm, between 15 µm and 100 µm. This can be obtained by any suitable method, for example by lithography followed by dry and wet etching. The via photo can be aligned to the second contact plugs 50 already present. This can be done by (1) front-to-backside alignment using an stepper or 1× aligner; or (2) through-wafer alignment using e.g. IR alignment.

In one implementation scheme, corresponding to the provision of the second contact plugs 50 as in FIG. 5(a), via holes 60 can stop on an etch stop layer 61 that is aligned with the bottom of the second contact plugs 50 and that is deposited during front side process for example on top of the front-end-of-line, so at the end of front-end processing or the first layer of PMD deposition (see FIG. 6(a)). This can for example be a SiC or SiN layer underneath or at the bottom of the PMD 13. The thickness of this etch stop layer 61 can vary between 10 nm and 100 nm, or between 20 nm and 50 nm or between 25 nm and 35 nm. In this case, etching has to take care of at least two materials: substrate 5 and STI 14—hence at least two etch chemistries are needed.

Figure 6D:
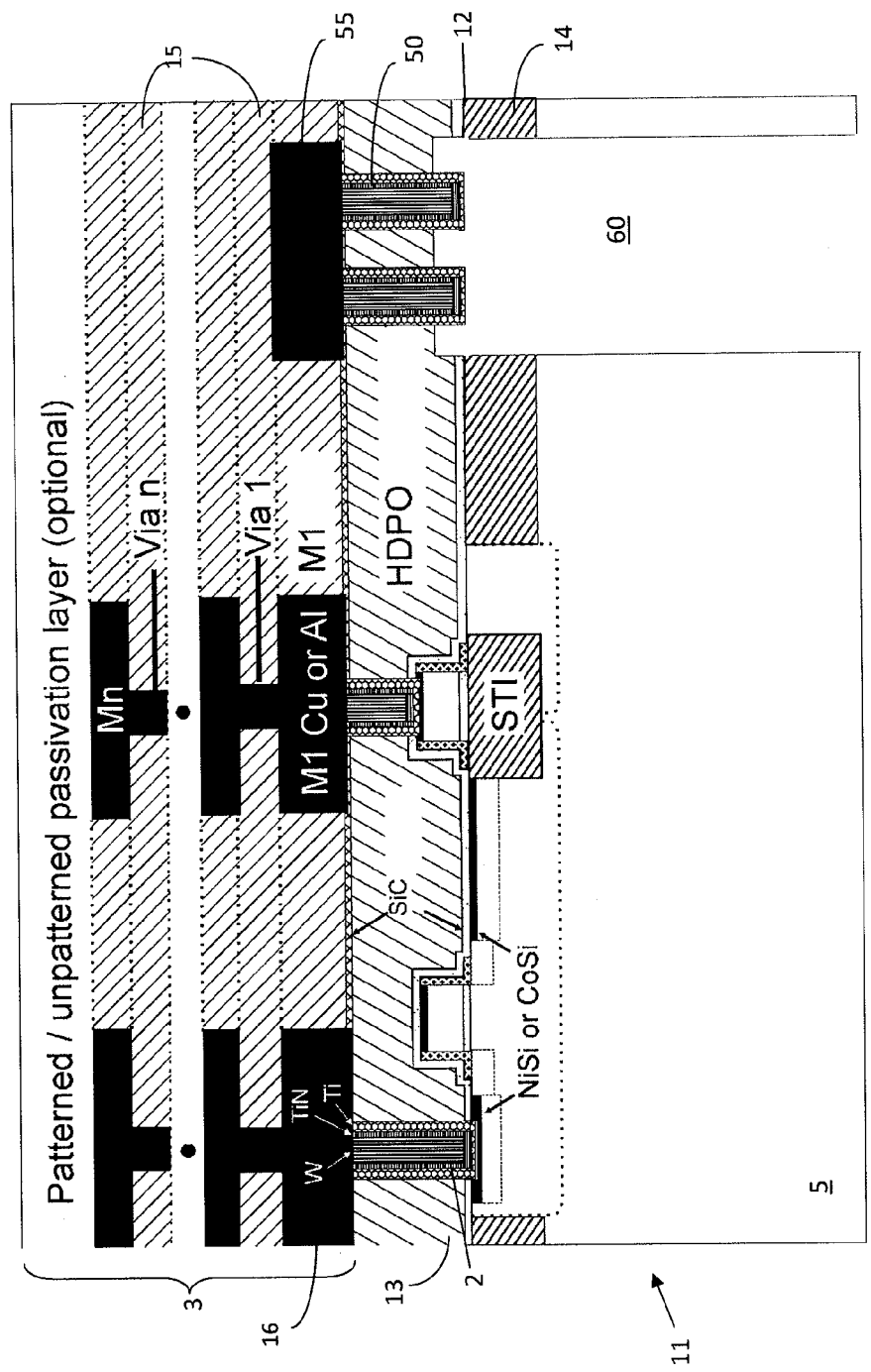

In another scheme, the hole 60 can be deeper and the second contact plugs 50 can partially stick into the via holes 60 as illustrated in FIG. 6(d). Hole drilling could for example be performed using dry and/or wet etching or laser drilling. Etching is a collective (wafer level) process whereas laser drilling is a sequential process (via by via). Etching has a throughput advantage for cases with a high number of vias. In this case, also at least part of the PMD 13 needs to be removed.

In yet another scheme, corresponding to the provision of the second contact plugs 50 as in FIG. 5(b), via holes 60 can stop on the STI 14 (see FIG. 6(b)). In this case, manufacturing of the via holes 60 only has to take the substrate material 5 into account. This is particularly useful for out-house processing.

In still another scheme, corresponding to the provision of the second contact plugs 50 as in FIG. 5(c), via holes 60 can stop on a silicide layer 56 aligned with the bottom of the second contact plugs 50 and deposited during FEOL processing (see FIG. 6(c)).

Stopping in the silicide 56 avoids etching through the PMD 13 and STI 14, both of which may be technology dependent and may cause extra process difficulties. Furthermore, end-point detection of the etching process can be done more easily on a silicide layer 56. On the other hand, if during the substrate via etch the second contact plugs 50 are (intentionally or unintentionally) etched, causing one or more tiny contact hole(s), they can be refilled during the subsequent barrier seed deposition and metallization, eg. Cu electroplating.

After provision of the via holes 60, these via holes 60 can be filled with a conductive material 70 (see FIG. 7) for making electrical contact to the IC via the extra second contact plugs 50 provided according to embodiments of the present invention. Materials that can be used for filling can for example be Cu, W, Al, Ti, Co, conductive polymers or any other material used in the field. These materials can be deposited by electroplating, or by any other method used in the field. The material 70 for filling the TSV holes 60 and the material of the second contact plugs 50 should be chosen such as to realize good electrical contact between the TSVs and the second contact plugs 50.

Underneath the conductive material 70 other layers can be deposited, such as an isolation liner 71, barrier layers blocking diffusion of layers into surrounding material, adhesion layers, layers for improving electrical contact. For example a combination of Ti and TiN can be used in case of W or Al material 70 or a combination of Ta and TaN in case of Cu material 70.

Via fill can include different substeps. First an isolation layer 71 can be deposited (e.g. oxide, nitride, polymer . . . ). Typical examples would be (PE- or SA-) CVD oxide or nitride (for example between 20 nm and 2000 nm), or spin-on/spray-on/CVD polymers (for example between 0.5 µm and 10 µm). This can be followed by deposition of a diffusion barrier (e.g. PVD, ALD . . . Ti, TaN, TiN, W, Ru, . . . with typical thicknesses in the range of 5 nm-20 nm) or combinations thereof with an adhesion layer, such as Ti or Ta. Alternatively a diffusion barrier could be deposited underneath the insulating material or liner.

For filling often a seed layer (in case of Cu, . . . ) can be deposited (for example PVD-Cu with a nominal field thickness of 100-1000 nm) followed by metallization with for example ECD Cu, Cu paste, solder, Au, . . . or CVD-W, Cu, . . . . Metallization could be conformal for large vias (typically diameter>20 µm) or fully filled (typically for diameters<10 µm). Conformal metallization could be in the thickness range of 1-5 µm (ECD-case) or in the range of 500-2000 nm (CVD-case).

The TSVs can have diameters varying between 500 nm and 500 µm, 1 and 120 µm between 1 µm and 100 µm, between 1 µm and 5 µm, or between 15 µm and 100 µm. The depth of the vias can vary between 5 µm and 500 µm, between 10 µm and 300 µm, between 10 µm and 200 µm, between 15 µm and 200 µm, between 20 µm and 100 µm. The aspect ratio can be chosen such as to realize good filling of the TSVs and may vary between 1 and 20, between 1 and 10, between 2 and 5.

A general overview of a process flow of methods according to embodiments of the present invention is given in FIG. 8. A substrate 5 is selected—step 81, and FEOL processing is performed—step 82—during which FEOL devices are formed on the substrate 5. Thereafter, BEOL processing is carried out—step 83. This BEOL processing comprises providing first contacts 2 for providing an electrical connection between the FEOL 1 and the metal levels, in particular metal1 16, in the BEOL 3. According to embodiments of the present invention, the BEOL processing also comprises providing at least one second contact plug, and optionally an array of second contact plugs 50—step 85—where later on the TSV 75 will land on. Thereafter, normal BEOL processing is carried out—step 86—as known in the art, e.g. by providing a plurality of metal layers divided into metal pads for electrically connecting to the FEOL devices 1, the metal layers being separated from one another by means of dielectric layers 15, vias going through the dielectric layers 15 as appropriate for making the electrical contacts between the different metal layers as required. The second contact plugs 50 are such that at one side they are in electrical contact with a metal pad 55 of a metal layer of the BEOL processing, e.g. with metal1 layer 16. Once the BEOL processing is finished, the manufactured device can either be shipped out-house for further processing in accordance with embodiments of the present invention, or can further be dealt with in-house. The further processing comprises providing a TSV 75 landing on the second contact plugs 50—step 87.

EXAMPLES

An example of TSVs for C130 technology is presented here. First C130 Front-End-Of-Line is fabricated.

Then a Pre Metal Dielectric stack (PMD) is deposited which comprises the following processing steps:
50 nm PECVD SiC 61 deposition,
700 nm HighDensityPlasma (HDP) Boron doped PhosphoSilicateGlass (B-PSG) 13 deposition,
Chemical Mechanical Polishing (CMP) of the PSG layer down to a thickness of 500 nm,
Deposition of 20 nm PECVD nitride.

Then first contacts 2 are printed with CD or diameter of 150 nm. For contacting the Through Substrate Vias (TSVs) 75, at least one second contact plug 50 and optionally one or more arrays of second contact plugs 50 in a 10 µm diameter region (13×13 circular area array with a pitch of 800 nm) are printed on the location of the metal bond pads 55 for contacting the TSVs 75. These first contacts 2 and second contact plugs 50 are filled with 15 nm IMP Ti and 10 nm MOCVD TiN, followed by 350 nm W and W-CMP to remove excess W on field areas between contacts.

Then Inter Metal Dielectric 1 (IMD1) is deposited with 50 nm PECVD SiC 76 and 300 nm PECVD SiO2 77.

Litho and etch are performed in a single damascene fashion with minimal CD of 150 nm. Metal bond pads 55 of 50 µm×50 µm for contacting the TSVs 75 are printed on top of the second contact plugs 50. Then the baseline metal 1 metallization process is used to fill the M1 trenches. This includes depositing 10 nm PVD TaN, 15 nm PVD Ta, Cu seed of 100 nm, Cu electroplating of 600 nm, followed by CMP to remove the excess copper on field regions between M1 lines. Then the following metal levels are fabricated, and the vias for interconnecting the different metal levels.

After finalizing front-end-of-line and back-end-of-line processing, the wafer is thinned at the backside down to a thickness of 50 µm. This is done with grinding and subsequent etching. The thickness uniformity is better than 2 µm.

For fabricating the TSVs 75 litho is done at the backside of the wafer 11. The diameter of the holes is 35 µm. The resist used is IX845 with a thickness of 2.5 um. The vias 60 are etched through the Si wafer, stopping at the bottom of the second contact plugs 50. Etching is done with standard Bosch processing known as deep reactive ion etch (DRIE). Then the resist is stripped.

First an insulating layer 71 of 5 µm polymer is deposited in the vias 60. Subsequently a layer of 70 nm Ti is deposited with PVD followed by a layer of 500 nm Cu deposited (acting as a seed layer) with PVD. A resist layer is deposited and patterned thereby creating holes in the resist layer at the locations of the vias 60. Then Cu 70 is plated on the Cu areas either conformally with a thickness of 5 µm or the via hole is completely filled with Cu 70 using techniques know as bottom-up plating. Finally the resist is stripped and the remaining Ti/Cu seed layer is removed at location where there was no Cu plating.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing a through substrate via (TSV) in a semiconductor chip, the method comprising:
    providing the semiconductor chip, the chip comprising:
        a substrate with a front-end-of-line (FEOL) comprising at least one device of the chip and further comprising a shallow trench isolation (STI) formed in the substrate,
        a back-end-of-line (BEOL) comprising a metal one layer formed over the FEOL,
        a pre-metal dielectric interposed between the substrate and the metal one layer, wherein the pre-metal dielectric comprises a portion interposed between the STI and the metal one layer,
        at least one first contact to the at least one device, and
        at least one second metal contact plug extending through the portion of the pre-metal dielectric interposed between the STI and the metal one layer, such that the at least one second metal contact plug electrically contacts the metal one layer at an upper portion and contacts the STI at a lower portion,
        wherein the at least one first contact and the at least one second metal contact plug are formed in a single contact formation process and comprise a same metal material;
    subsequent to providing the semiconductor chip, forming a TSV hole through a backside of the substrate to expose at least a part of the lower portion of the at least one second metal contact plug, the TSV hole not extending up to the metal one layer of the BEOL; and
    after forming the TSV hole, filling the TSV hole with a metallic material such that an electrical connection between the metallic material and the metal one layer is realized via the at least one second metal contact plug in contact with the metallic material and in contact with the metal one layer.

2. The method of claim 1, wherein providing the semiconductor chip includes providing the at least one second metal contact plug at a location where a TSV is to land.

3. The method of claim 1, wherein forming the TSV hole comprises etching the TSV hole and filling the TSV hole before stacking the chip onto another chip.

4. The method of claim 1, further comprising thinning the substrate from a backside of the substrate before forming the TSV hole.

5. The method of claim 1, wherein forming the TSV hole includes etching the TSV hole through the substrate and stopping prior to the pre-metal dielectric such that the TSV hole does not extend into the pre-metal dielectric.

6. The method of claim 1, wherein forming the TSV hole includes etching to extend the TSV hole at least partially through the pre-metal dielectric.

7. The method of claim 1, wherein the at least one second metal contact plug includes a plurality of second metal contact plugs.

8. The method of claim 7, wherein the at least one second metal contact plug includes at least four second metal contact plugs.

9. The method of claim 1, wherein providing the semiconductor chip further comprises forming a silicided contact in the substrate in electrical contact with the at least one second contact plug.

10. The method of claim 9,
wherein forming the TSV hole includes etching through the substrate without further etching a silicided material from the silicided contact, and
wherein filling the TSV hole with the metallic material includes depositing the metallic material in electrical contact with the silicided contact.

11. The method of claim 9, wherein providing the semiconductor chip further comprises forming a diode comprising doped semiconductor regions and the silicided contact, wherein the diode is connected to a metal pad through the silicided contact.

12. The method of claim 1, wherein forming the TSV hole further includes etching at least partially through the STI, such that the lower portion of the at least one second metal contact plug electrically contacts the metallic material above a bottom interface between the STI and the substrate.

13. The method of claim 12, wherein forming the TSV hole includes etching entirely through the STI, such that the at least one second metal contact plug electrically contacts the metallic material at or above a top surface of a dielectric material of the STI.

14. The method of claim 1, wherein the at least one second metal contact plug further extends at least partially through the STI, such that the lower portion of the at least one second metal contact plug contacts the metallic material below a top surface of a dielectric material of the STI.

15. The method of claim 14, wherein the at least one second metal contact plug extends entirely through the STI, such that the lower portion of the at least one second metal contact plug contacts the metallic material at or below a bottom interface between the STI and the substrate.

* * * * *